United States Patent [19]

Orihashi

[11] Patent Number: 4,755,758
[45] Date of Patent: Jul. 5, 1988

[54] WAVE FORMATTER FOR A LOGIC CIRCUIT TESTING SYSTEM

[75] Inventor: Ritsuro Orihashi, Yokohama, Japan

[73] Assignee: Hitachi, Ltd., Tokyo, Japan

[21] Appl. No.: 804,069

[22] Filed: Dec. 3, 1985

[30] Foreign Application Priority Data

Dec. 3, 1984 [JP] Japan ............................... 59-253996

[51] Int. Cl.⁴ .......................... H03K 1/17; H03K 7/00; H03K 17/00
[52] U.S. Cl. ...................................... 328/63; 328/72; 328/119; 377/78
[58] Field of Search ....................... 328/14, 63, 71, 55, 328/58, 119; 307/529; 377/69, 70, 77, 78

*Primary Examiner*—Stanley D. Miller
*Assistant Examiner*—Timothy P. Callahan
*Attorney, Agent, or Firm*—Antonelli, Terry & Wands

[57] ABSTRACT

A wave formatter for generating an output waveform used in a logic circuit testing system is disclosd. The wave formatter includes a data generator for outputting in parallel a plurality of data signals having a polarity and a type in response to a control signal for determining the polarity of the data signals and a control data signal for determining the type of the data signals which are received on external input lines of the data generator in synchronism with a test cycle clock. The data generator decodes the control data signals to produce the plurality of data signals in parallel. A shift data supply is provided which receives the plurality of data signals from the data generator and samples the plurality of data signals to output in parallel data signals in response to the test cycle clock. A timing control is provided with external lines for receiving clock input signals and which generate a signal for controlling an operation mode of a shift register on the basis of the clock input signals which are externally supplied to the external lines. A shift register receives the data in parallel with the shift data supply and the signal for controlling an operation mode and outputs the output waveform serially as a function of the signal for controlling an operation mode.

3 Claims, 3 Drawing Sheets

FIG. 2

| WAVE FORM | LOGIC DATA | DATA OUTPUT | | |
|---|---|---|---|---|
| | TERMINAL 113 | LINE 115 | LINE 119 | LINE 120 |
| NRZ | 0 | X | 0 | 0 |
| NRZ | 1 | X | 1 | 1 |
| RZ | 0 | X | 0 | 0 |
| RZ | 1 | X | 1 | 0 |
| EOR | 0 | 0 | 1 | 0 |
| EOR | 1 | 1 | 0 | 1 |

FIG. 3

| WAVE FORM | LOGIC DATA | MULTIPLEXER INPUT | | SEL | OUTPUT | |
|---|---|---|---|---|---|---|
| | TERMINAL 113 | LINE 115 | LINE 125 | LINE 114 | LINE 118 | |
| NRZ | 0 | X | $Q_n$ | 0 | $Q_n$ | SELECTED 125 |
| NRZ | 1 | X | $Q_n$ | 0 | $Q_n$ | DO. |
| RZ | 0 | X | $Q_n$ | 0 | $Q_n$ | DO. |
| RZ | 1 | X | $Q_n$ | 0 | $Q_n$ | DO. |
| EOR | 0 | 0 | $Q_n$ | 1 | 0 | SELECTED 115 |
| EOR | 1 | 1 | $Q_n$ | 1 | 1 | DO. |

WAVE FORMATTER FOR A LOGIC CIRCUIT TESTING SYSTEM

BACKGROUND OF THE INVENTION

The present invention relates to a wave formatter for generating various waveforms for use with a logic circuit testing system of an electronic equipment or the like.

When the functional test of a logic circuit is carried out, it is necessary that the test is carried out by applying various types of waveforms, such as a NRZ (Non-Return-to-Zero) waveform, RZ (Return-to-Zero) waveform and exclusive OR (EOR) waveform of NRZ and RZ to the logic circuit. A conventional wave formatter for generating various types of waveforms by separately adjusting the time of each change point of the rise and the fall of the waveform to be generated is disclosed in laid-open Japanese Patent Publication No. 111470/1982.

By use of this conventional wave formatter, a waveform having an accurate timing can be generated, but the same number of wave formatters as the number of channels of a logic circuit testing system are required. For this, there is a problem that, when it is used with a multi-channel logic circuit testing system, the number of parts such as delay circuits or elements for calibration increases, which causes the calibrating steps to increase.

SUMMARY OF THE INVENTION

In view of the above problem of the conventional apparatus, the object of the present invention is to provide a wave formatter for generating accurate waveforms without using a delay circuit for calibration in the conventional apparatus, which has a comparatively simple construction and a decreased calibrating time.

To achieve this object, the wave formatter of the present invention comprises a data generating circuit for generating in parallel shift register control data on the basis of control data hereinafter called "logic data" for determining the polarity of a waveform such as "0" given to sense a negative polarity waveform or "1" given to sense a positive polarity waveform and control data for determining the type of the waveform, such as the aforementioned NRZ, RZ and EOR data both of which are externally input in synchronism with a test cycle clock, a shift data supply circuit which receives the data from the above data generating circuit and provides the necessary processings respectively required by both control data so as to output in parallel the data signals for determining the kind and the polarity of the waveform, a timing control circuit for generating a signal for controlling the operation mode of the shift register (load/shift control signal) and a clock signal for driving the shift register on the basis of the driving clock signals which are externally supplied and are independent of each other, and a shift register adapted so that the data sent out in parallel from the above shift data supply circuit are first present and then output serially by the above load/shift control signal and the above clock signal for driving the shift register.

BRIEF DESCRIPTION OF THE DRAWING

FIGS. 2 and 3 are tables showing the conditions for obtaining the respective waveforms.

DESCRIPTION OF THE PREFERRED EMBODIMENT

An embodiment of the wave formatter of the present invention is described below with reference to the drawings.

Figure 1:
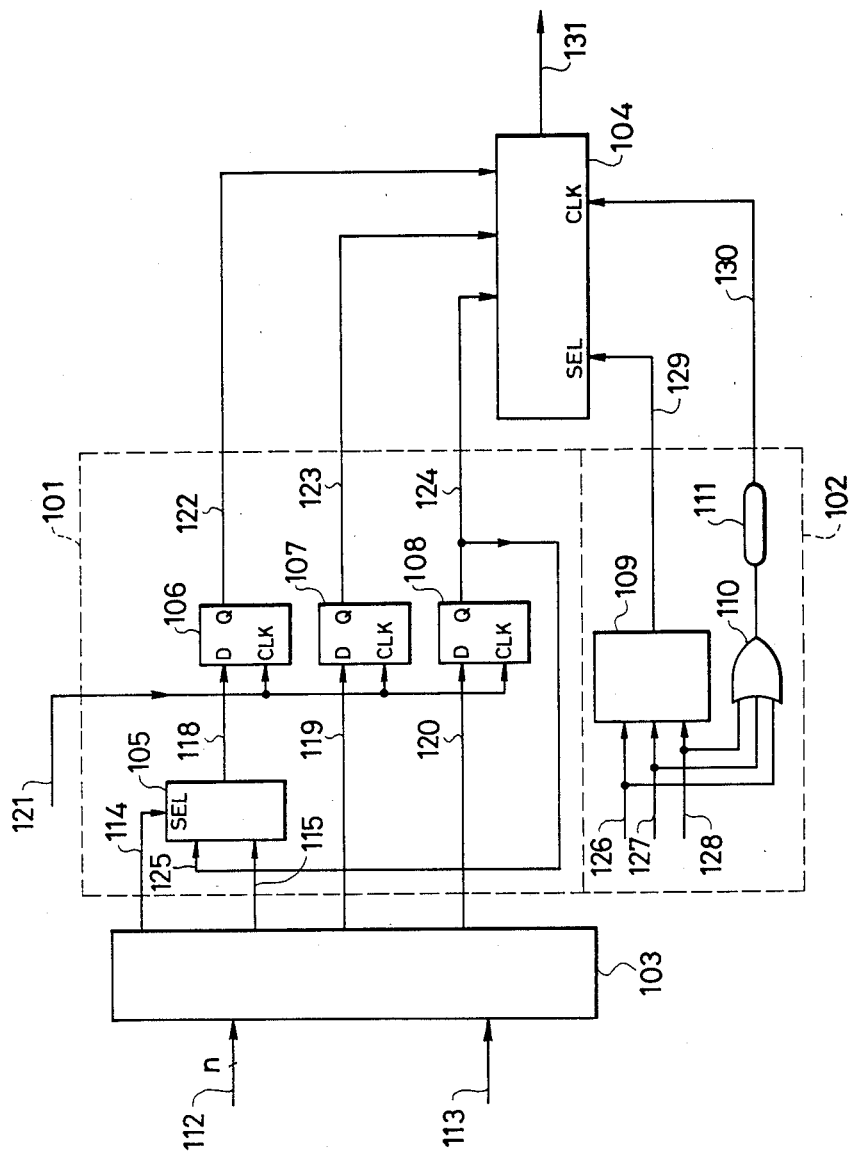
FIG. 1 is a schematic diagram of a logic circuit forming a wave formatter which is an embodiment of the present invention.

FIG. 1 shows wave formatter which comprises a data signal generating circuit 103, a shift data supply circuit 101, a timing control circuit 102 and a shift register 104.

The data signal generating circuit 103 is provided with an input line 113 for the later described logic data for specifying the polarity of the waveform such as "0" for a negative waveform or "1" for a positive waveform to be generated and an input line 112 for the multiple-bit data for controlling the waveform, and it is constructed so as to decode the data signals from the above two input lines 112 and 113 and output them to the shift register supply circuit 101.

The data signal generating circuit 103 is constructed similarly to the New Waveform Formatter Circuit of FIG. 6 on page 147 of the 1981 IEEE Test Conference publication entitled "ANALYSIS AND DEFINITION OF OVERALL TIMING ACCURACY IN VSLI TEST SYSTEM".

The input line 112 usually has plural lines because of the several bits of data for controlling the waveform mentioned before. In the case of using the three types of waveforms NRZ, RZ and EOR, the line 112 should have at least two lines because each line serves to transmit the data signal in two states, e.g. "1" or "0", for the type of the waveform such as NRZ, RZ and EOR.

When the waveforms (NRZ, RZ, EOR) on lines identified by 112 and the polarity as specified by line 113 of each of the input lines identified by 112, are as shown in FIG. 1, the waveforms and the polarity of each of the output lines 115, 119, 120, 114, and 125 of the circuit 103 are as shown in FIGS. 2 and 3.

Both control data are input to the data signal generating circuit 103 in synchronism with a test cycle clock 121, not shown in detail. The shift data supply circuit 101 consists of D-flip-flops 106, 107 and 108 (hereinafter abbreviated to D-FF) and a selector 105, and the test cycle clock 121 is input to the respective D-FF's 106-108 as a clock signal. Data, for instance, 3-bit data supplied from the data signal generating circuit 103 is directly input to the D-FF's 107 and 108 via signal lines 119 and 120, respectively, and is input to the D-FF 106 via a signal line 118 after passing through the selector 105. To the above selector 105, a select data signal is supplied from the data signal generating circuit 103 via a signal line 114, and, by this select signal, the selector 105 selects either the data supplied to the selector 105 from the data signal generating circuit 103 via a signal line 115 or the data supplied to the selector 105 from the Q output of the D-FF 108 via a signal line 125, and it supplies the selected data to the D-FF 106 via the signal line 118.

The timing control circuit 102 comprises a mode controller 109, an OR gate 110 and a delay line 111, and three clock input lines 126, 127 and 128 are connected to the mode controller 109 and the OR gate 110, respectively, so that three clocks are input to each of them. Accordingly, the above three clock inputs are logically added by the OR gate 110, and the ORed clock is further output via the delay circuit 111 to a signal line 130.

Incidentally, the above delay line 111 is used for calibration of the timing between the clock signal and the shift register operation control signal, and it is only used very rarely.

To the shift register 104, the outputs from the D-FF's 106, 107 and 108 of the shift data supply circuit 101 are input via signal lines 122, 123 and 124, respectively. In addition, from the timing control circuit 102, the shift register operation control signal is input to the above shift register 104 from the above mode controller 109 via a signal line 129, and the ORed clock passing through the above delay line 111 is also input to the shift register 104 via the signal line 130.

The shift register operation control signal (the later described signal M), which is output from the mode controller 109 via the signal line 129, controls the two operations, preset and shift, and regardless of the kind of the waveform to be generated, it controls the operation of the shift register 104 in the sequence "preset→shift→shift" while synchronizing with the three clocks which are input from the above clock input lines 126-128 within the test cycle of the above test cycle clock.

The above-mentioned "preset" means that the signals sent out in parallel from the shift data supply circuit 101 via the signal lines 122 and 123 are preset simultaneously in parallel in the shift register 104. The preset data is serially output from the shift register 104 by the sequential shift operation, and, as a result, the generated waveform is obtained via a signal line 131.

With the above circuit construction, for instance, as shown in FIGS. 2 and 3, it is assumed that the data signal generating circuit 103 selectively outputs one of the three types of waveforms, i.e. the NRZ waveform, RZ waveform or the EOR waveform to lines 114, 115, 119 and 120 as shown in FIGS. 2 and 3. In FIGS. 2 and 3, the mark (X) means "Don't Care", so either "0" or "1" is applicable. In addition, the mark (Qn) designates the logic value of the data, that is logic data, which determines the shape and polarity of the waveform at the above selector 105 via the signal line 125, as well as the logic value of the data which is input via the signal line 124 to the most significant bit of the shift register 104.

Figure 4:
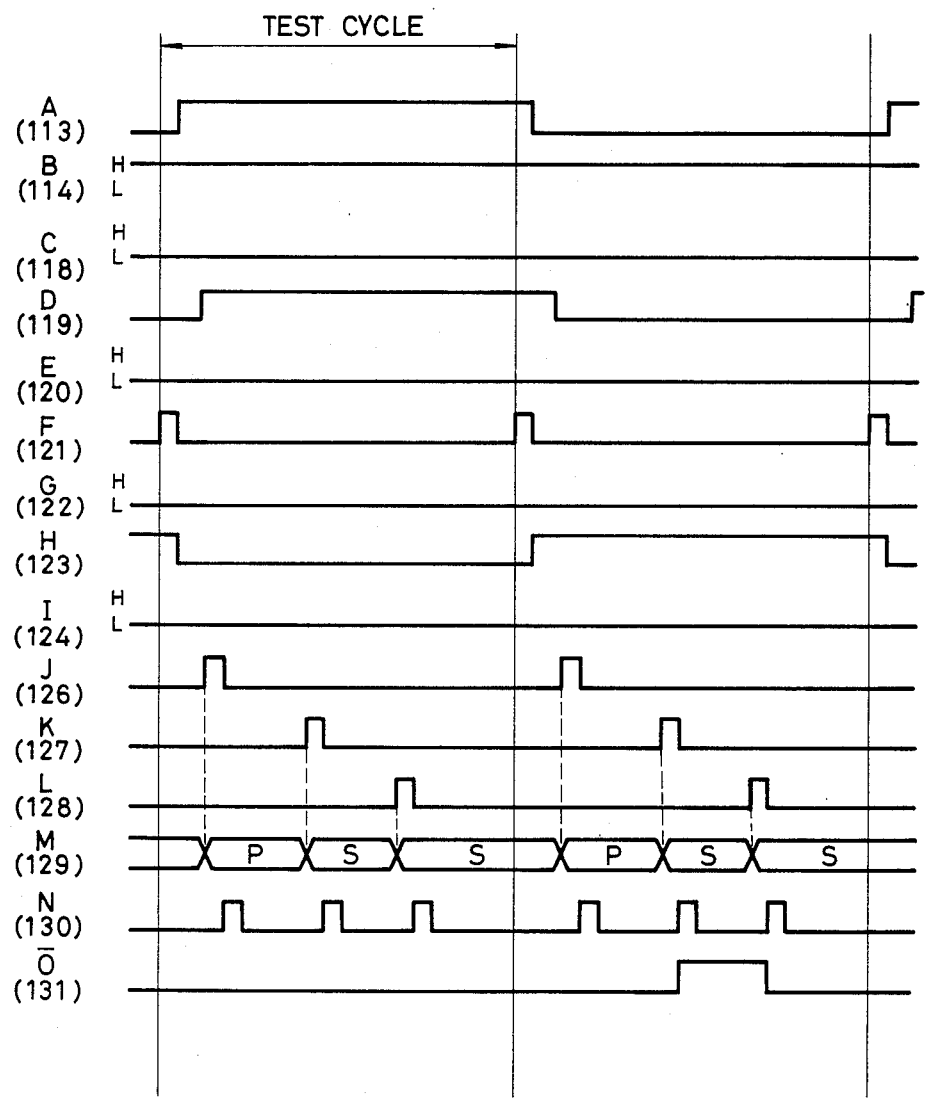
FIG. 4 is a time chart for the output of an RZ waveform.

Then, using the generation of a positive RZ waveform and a negative RZ waveform as an example, the operation is described with reference to the time chart of FIG. 4. The positive RZ waveform and the negative RZ waveform are the RZ waveforms which are obtained via line 131 when the logic data supplied from the line 113 is "1" (positive) and when it is "0" (negative), respectively. The logic data signal A transmitted on the signal line 113, which is connected to the input terminal of the data signal generating circuit 103, changes in logic value e.g. "1" or "0" for every test cycle as shown in FIG. 4. As shown in FIG. 3, since the select shift data signal B (transmitted along the signal line 114) is adapted to always select the signal line 125, it always stays, for instance, in the "LOW" state (refer to the "L" indication of the signal B in FIG. 4). The data which is input to the D-FF's 106, 107 and 108, that is the data transmitted along the signal lines 118, 119 and 120 become data C, D and E, respectively. The outputs obtained by sampling the data C, D and E with the test cycle clock F which is input from the clock input 121 are data G transmitted along the signal line 122, data H transmitted along the signal line 123 and data I transmitted along the signal line 124, respectively, and they are supplied to the shift register 104.

On the other hand, the clocks which are input from the clock inputs 126, 127 and 128 are supplied as data J, K and L, respectively, and the shift register operation control signal M and the shift register clock N are generated in the timing control circuit 102. "P" as indicated in the shift register operation control signal M represents the preset mode, and "S" represents the shift mode. The data of each bit of the shift register 104 is output by the shift register operation control signal M and the shift register clock N, and an RZ waveform $\overline{O}$ is obtained from the generated waveform output 131.

Since the RZ waveform $\overline{O}$ is obtained as mentioned above, the timing accuracy of the generated waveform can be established, and a waveform having accurate timing can be obtained without using a delay element because the signal transmission path of the shift register clock line 130, as shown in FIG. 1, from the timing control 102, which connects to the shift register 104, is always used for only transmission and the transmission path is fixed which results in using the same path regardless of the type and polarity of the waveform.

As apparent from the above embodiment, according to the wave formatter of the present invention, the shift register is controlled by the timing control circuit for generating the control signal which is fixed regardless of the type and polarity of the waveform to be generated and the driving clock for driving the above shift register, and, thus, the path passed by the driving clock is fixed regardless of the type and polarity of the waveform, and an accurate waveform can be obtained without using a delay circuit or the like for timing adjustment. By this, it is possible to prevent the increases of the hardware amount and the number of the adjusting steps, which are expected when a delay circuit or the like is provided.

What is claimed is:

1. A wave formatter for generating an output waveform used in a logic circuit testing system comprising:

data generating means for outputting in parallel a plurality of data signals having a polarity and a type in response to a control data signal for determining the polarity of the data signals and a control data signal for determining the type of the data signals which are received on external input lines of said data generating means in synchronism with a test cycle clock, said data generating means decoding said control data signals to produce said plurality of data signals in parallel;

shift data supply means which receives the plurality of data signals from said data generating means and samples the plurality of data signals to output in parallel data signals in response to the test cycle clock;

timing control means which is provided with external lines for receiving clock input signals and which generates a signal for controlling an operation mode of a shift register on the basis of the clock input signals which are externally supplied to said external lines; and a shift register which receives data in parallel from said shift data supply means and said signal for controlling an operation mode and outputs said output waveform serially as a function of said signal for controlling an operation mode.

2. A wave formatter for generating an output waveform used in a logic testing system according to claim 1, wherein said timing control means includes a transmission path for providing a clock signal for driving said shift register.

3. A wave formatter for generating an output waveform used in a logic circuit testing system according to claim 1, wherein said timing control means includes a transmission path for providing a clock signal for driving said shift register, and said transmission path comprises an OR gate circuit and a delay line.

* * * * *